US009766450B2

(12) United States Patent
Nakagawa et al.

(10) Patent No.: US 9,766,450 B2
(45) Date of Patent: Sep. 19, 2017

(54) LIGHT DEFLECTOR, TWO-DIMENSIONAL IMAGE DISPLAY APPARATUS, OPTICAL SCANNER, AND IMAGE FORMING APPARATUS

(71) Applicants: Jun Nakagawa, Kanagawa (JP); Tsuyoshi Hashiguchi, Kanagawa (JP); Eri Watanabe, Kanagawa (JP); Goichi Akanuma, Kanagawa (JP); Tomofumi Kitazawa, Kanagawa (JP)

(72) Inventors: Jun Nakagawa, Kanagawa (JP); Tsuyoshi Hashiguchi, Kanagawa (JP); Eri Watanabe, Kanagawa (JP); Goichi Akanuma, Kanagawa (JP); Tomofumi Kitazawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 26 days.

(21) Appl. No.: 14/872,682

(22) Filed: Oct. 1, 2015

(65) Prior Publication Data

US 2016/0109697 A1  Apr. 21, 2016

(30) Foreign Application Priority Data

Oct. 15, 2014 (JP) .................................. 2014-210894
Aug. 3, 2015 (JP) .................................. 2015-153563

(51) Int. Cl.
*G02B 26/08* (2006.01)
*G02B 26/10* (2006.01)
(Continued)

(52) U.S. Cl.
CPC .......... *G02B 26/101* (2013.01); *B81B 3/0045* (2013.01); *G02B 26/0858* (2013.01);
(Continued)

(58) Field of Classification Search
CPC ............ G02B 26/0858; G02B 26/0833; G02B 26/0841; G02B 26/085; G02B 26/101;
(Continued)

(56) References Cited

U.S. PATENT DOCUMENTS 6,067,421 A   5/2000  Kitazawa et al.
6,177,667 B1  1/2001  Fujita et al.
(Continued)

FOREIGN PATENT DOCUMENTS

EP   2 453 570 A2   5/2012
JP   2012-185314    9/2012
(Continued)

OTHER PUBLICATIONS

Extended European Search Report dated Mar. 1, 2016 in Patent Application No. 15188669.4.

*Primary Examiner* — James Phan
(74) *Attorney, Agent, or Firm* — Oblon, McClelland, Maier & Neustadt, L.L.P.

(57) ABSTRACT

A light deflector is provided including a mirror unit having a light reflection plane, a movable frame to support the mirror unit, a support frame disposed to surround the movable frame, a pair of serpentine beams each disposed between the movable frame and the support frame on both sides of the movable frame to form a turning shape, each of the serpentine beams having one end attached to the support frame, and another end attached to the movable frame, and a vibration damper provided on a portion that moves due to deformation of the serpentine beams caused by application of voltage being transferred.

13 Claims, 13 Drawing Sheets

(51) Int. Cl.
*H04N 9/31* (2006.01)
*B81B 3/00* (2006.01)

(52) U.S. Cl.
CPC ...... *H04N 9/3129* (2013.01); *B81B 2201/032* (2013.01); *B81B 2201/042* (2013.01)

(58) Field of Classification Search
CPC ............ B81B 3/0045; B81B 2201/032; B81B 2201/042; H04N 9/3129
USPC ...................... 359/198.1–199.4, 200.6–200.8, 359/224.1–224.2; 399/206, 216; 347/243, 259–260
See application file for complete search history.

(56) References Cited

U.S. PATENT DOCUMENTS 8,830,551 B2 * 9/2014 Kitazawa ............... H02N 1/006 359/200.8
2007/0127111 A1 6/2007 Hashiguchi et al.
2010/0014073 A1 1/2010 Hashiguchi et al.
2010/0245966 A1 9/2010 Yasuda
2010/0309536 A1 12/2010 Akanuma et al.
2012/0063715 A1 3/2012 Nakagawa et al.
2012/0120470 A1 5/2012 Kitazawa et al.
2012/0224239 A1 9/2012 Aimono
2013/0107339 A1 5/2013 Horie et al.
2015/0036201 A1 2/2015 Horie et al.
2015/0062683 A1 3/2015 Akanuma et al.
2015/0116803 A1 4/2015 Horie et al.

FOREIGN PATENT DOCUMENTS

JP 2015-057625 3/2015
WO WO 2011/027742 A1 3/2011
WO WO 2013/168386 A1 11/2013

* cited by examiner

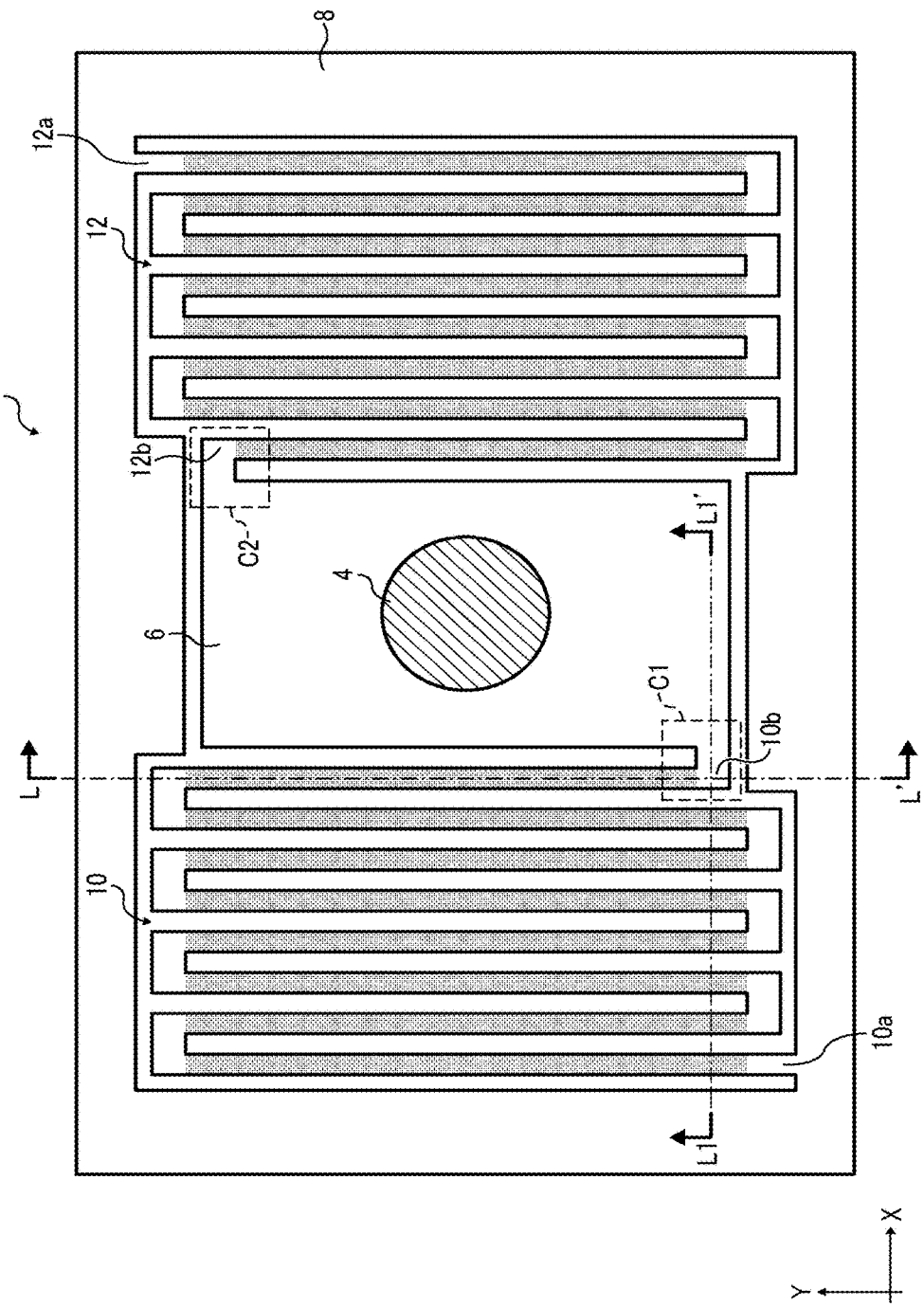

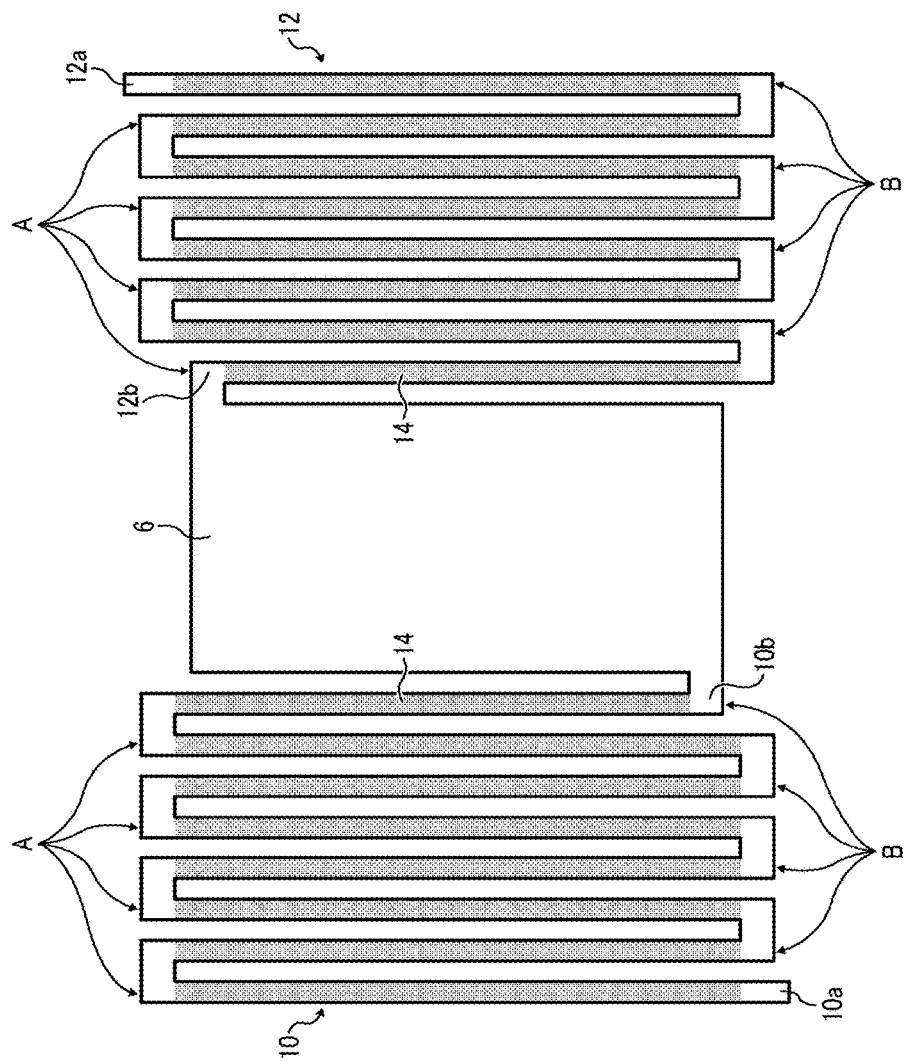

LIGHT DEFLECTOR, TWO-DIMENSIONAL IMAGE DISPLAY APPARATUS, OPTICAL SCANNER, AND IMAGE FORMING APPARATUS

CROSS-REFERENCE TO RELATED APPLICATIONS

This patent application is based on and claims priority pursuant to 35 U.S.C. §119(a) to Japanese Patent Application Nos. 2014-210894 and 2015-153563, filed on Oct. 15, 2014, and Aug. 3, 2015, respectively, in the Japan Patent Office, the entire disclosure of which is hereby incorporated by reference herein.

BACKGROUND

Technical Field

Embodiments of the present invention relate to a light deflector, a two-dimensional image display apparatus, an optical scanner, and an image forming apparatus.

Background Art

Currently, compact light deflectors are under development, whose size is reduced by micromachining technology to which semiconductor manufacturing technology is applied, as devices for deflecting and scanning light beam. Such light deflectors each include a movable part on which a light reflection plane is disposed and a drive bar that oscillates the movable part, and the movable part and the drive bar are integrated into a substrate by adopting micromachining technology with which silicon or glass are micromachined. The drive bar is formed by superimposing a thin-film piezoelectric material on the surface of a cantilever, and the piezoelectric material serves as an actuator. The extension and contraction that are caused by the piezoelectric characteristics of the piezoelectric material towards and away from the surface propagate to a cantilever. Accordingly, the cantilever can be oscillated. Due to the oscillation of the cantilever, the light reflection plane rotates and oscillates. Accordingly, optical deflection is implemented.

When two-dimensional scanning is performed, resonant driving is used for optical scanning in the horizontal direction. As raster scanning is required to achieve finer-resolution display image and uniformity over the plane, non-resonant driving is usually adopted for optical scanning in the vertical direction.

SUMMARY

Embodiments of the present invention described herein provide a light deflector including a mirror unit having a light reflection plane, a movable frame to support the mirror unit, a support frame disposed to surround the movable frame, a pair of serpentine beams each disposed between the movable frame and the support frame on both sides of the movable frame to form a turning shape, each of the serpentine beams having one end attached to the support frame, and another end attached to the movable frame, and a vibration damper provided on a portion that moves due to deformation of the serpentine beams caused by application of voltage being transferred.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

FIG. 1 is a front view of a light deflector according to a first embodiment of the present invention.

FIG. 2 is a plan view of serpentine beams according to the first embodiment of the present invention.

Figure 3A:
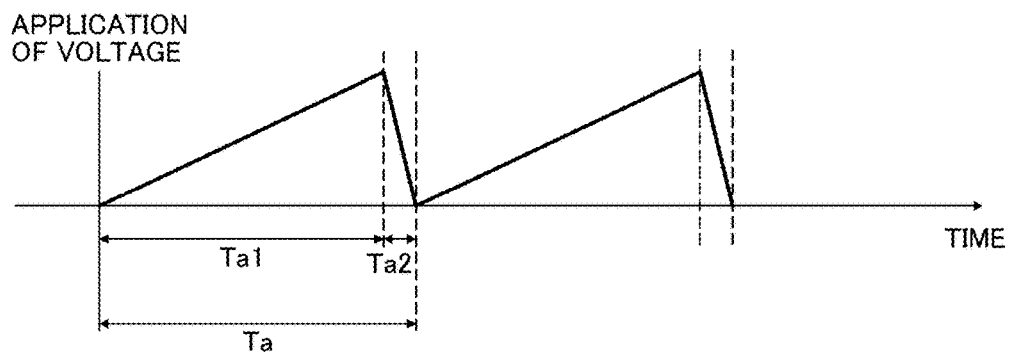
FIG. 3A is a diagram illustrating the waveform of the voltage (application of voltage) that is applied to a first serpentine beam, according to the first embodiment of the present invention.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

Embodiments of the present invention will be described below with reference to the drawings. A first embodiment of the present invention is described with reference to FIG. 1 to FIG. 8. FIG. 1 is a front view of a light deflector 2 according to the first embodiment of the present invention. The light deflector 2 is uniaxial-scanning light deflector capable of performing optical scanning in a vertical direction (Y direction). The light deflector 2 includes a mirror unit 4 having a light reflection plane, a movable frame 6 shaped like a flat plate and provided with the mirror unit 4, and a support frame 8 arranged to surround the periphery of the movable frame 6. Moreover, the light deflector 2 includes a first serpentine beam 10 and a second serpentine beam 12, disposed between the movable frame 6 and the support frame 8, on both sides of the Y-axis direction of the movable frame 6, respectively.

The first serpentine beam 10 has one end 10a attached to the support frame 8, and the other end 10b attached to the movable frame 6. A portion at which the other end 10b of the first serpentine beam 10 is attached to the movable frame 6 forms a connecting part C1. In a similar manner, one end 12a of the second serpentine beam 12 is attached to the support frame 8, and the other end 12b of the second serpentine beam 12 is attached to the movable frame 6. A portion at which the other end 12b of the second serpentine beam 12 is attached to the movable frame 6 forms a connecting part C2. As described above, the movable frame 6 is indirectly supported by the support frame 8 through the first serpentine beam 10 and the second serpentine beam 12.

FIG. 2 is a plan view of the first serpentine beam 10 and the second serpentine beam 12 according to the present embodiment. As illustrated in FIG. 2, the first serpentine beam 10 and the second serpentine beam 12 have a turning shape in which long and narrow beams A and B alternate in the X direction. On the surface of the beams A and B, except for turning portions, a piezoelectric member 14 is provided so as to enable the beams A and B to be driven in an independent manner. When different voltages are applied to the beams A and B of the piezoelectric member 14, respectively, bending (deformation) occurs on each of the beams A and B and the neighboring two beams bend in different directions. Such bending is accumulated and conveyed to the movable frame 6, and rotation and oscillation is caused to the non-resonating mirror unit 4 about the X-axis (=vertical direction). Accordingly, the light deflector 2 has a scanning function. In FIG. 2, the mirror unit 4 is omitted.

Figure 3B:
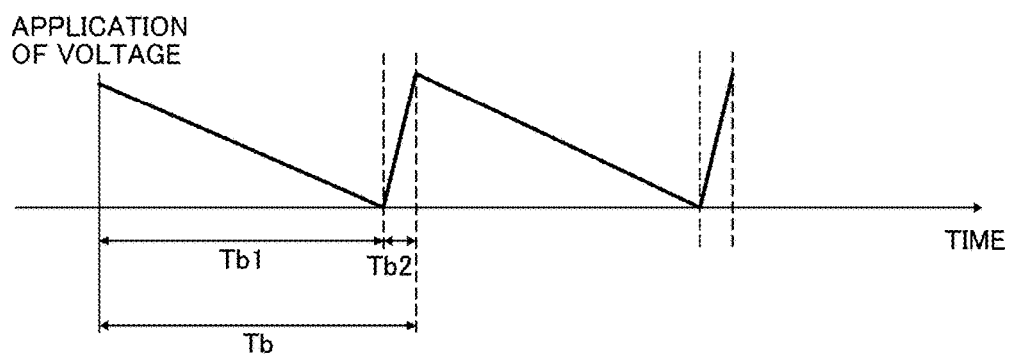
FIG. 3B is a diagram illustrating the waveform of the voltage (application of voltage) that is applied to a second serpentine beam, according to the first embodiment of the present invention.

Next, the operating principles of the light deflector 2 are described with reference to FIG. 3 and FIG. 4. FIG. 3A and FIG. 3B are diagrams illustrating the waveforms of the voltage (application of voltage) that are applied to the first and second serpentine beams 10 and 12, respectively, according to the present embodiment. Regarding the piezoelectric materials 14 provided for the beams A and B of the first serpentine beam 10 and the second serpentine beam 12, the sawtooth voltage that is illustrated in FIG. 3A is applied to the piezoelectric materials 14 of the beam A. On the other hand, the sawtooth voltage that is illustrated in FIG. 3B, which is inversely-shaped with reference to the sawtooth voltage illustrated in FIG. 3A, is applied to the piezoelectric materials 14 of the beam B.

Figure 4A:
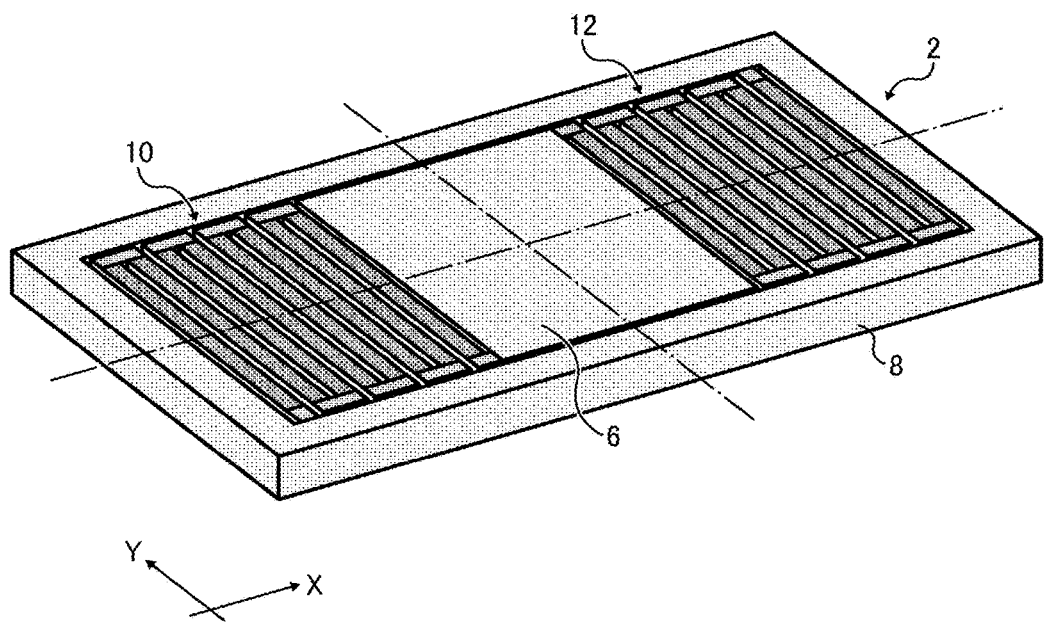
FIG. 4A is a perspective view of a light deflector on a non-operating state, according to the first embodiment of the present invention.
Figure 4B:
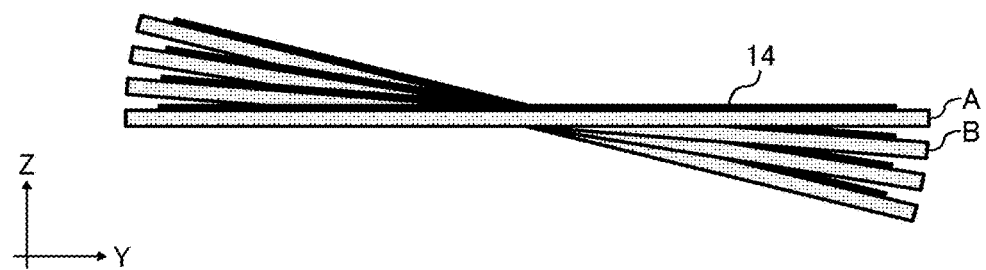
FIG. 4B is a side view of the deformation caused to the beams of a serpentine beam while a light deflector is in an operating state, according to the first embodiment of the present invention.

As voltages with different waveforms are applied to the piezoelectric materials 14 provided for the beams A and B, each of the first serpentine beam 10 and the second serpentine beam 12 serves as a cantilever, and the movable frame 6 rotates and oscillates. In FIG. 3A and FIG. 3B, "Ta" and "Tb" indicate a cycle of waveform, and "Ta1" and "Tb2" indicate the voltage waveform (sawtooth waveform) that is applied to the beam A. Moreover, "Ta2" and "Tb1" indicate the voltage waveform (sawtooth waveform) that is applied to the beam B. FIG. 4A is a perspective view of the light deflector 2 on a non-operating state, according to the present embodiment. FIG. 4B is a side view of the deformation caused to the beams of a serpentine beam while the light deflector 2 is in an operating state, according to the present embodiment.

Figure 5A:
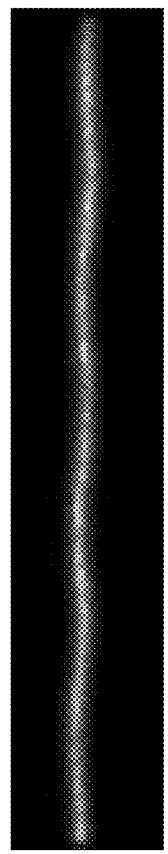
FIG. 5A is a diagram illustrating a state in which a vibration damper is absent and fluctuations in scanning line occur, according to the first embodiment of the present invention.
Figure 5B:
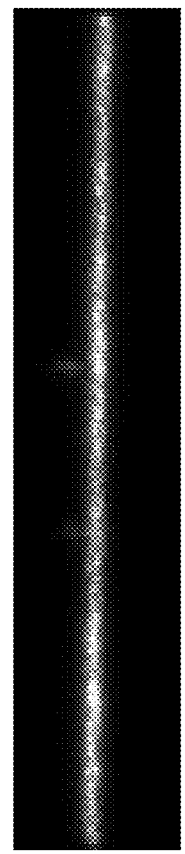
FIG. 5B is a diagram illustrating a state in which fluctuations in scanning line are reduced by a vibration damper, according to the first embodiment of the present invention.

Next, the fluctuations in position (fluctuations in scanning line) that occur when a light deflector of this kind is scanned by laser are described with reference to FIG. 5A and FIG. 5B. FIG. 5A and FIG. 5B are images obtained from an experiment in which how fluctuations in scanning line differ due to the presence or absence of a vibration damper are examined, according to the present embodiment. FIG. 5A is a diagram illustrating a state in which a vibration damper is absent and fluctuations in scanning line occur, and FIG. 5B is a diagram illustrating a state in which fluctuations in scanning line are reduced by a vibration damper. When a mirror unit is rotated and oscillated by raster operation in a light deflector provided with a serpentine beam, as illustrated in FIG. 5A, a laser scanning line fluctuates vertically with reference to the scanning direction. This is because a slight difference is caused in driving force between the first serpentine beam and the second serpentine beam due to errors in manufacturing processes of a light deflector and variations in driving force of piezoelectric materials. Moreover, it is known that such a phenomenon as above occurs when the structure within the movable frame becomes asymmetric.

When a light deflector that causes fluctuations in scanning line as above is applied to an image display apparatus, contribution to higher resolution may be impaired.

Figure 6A:
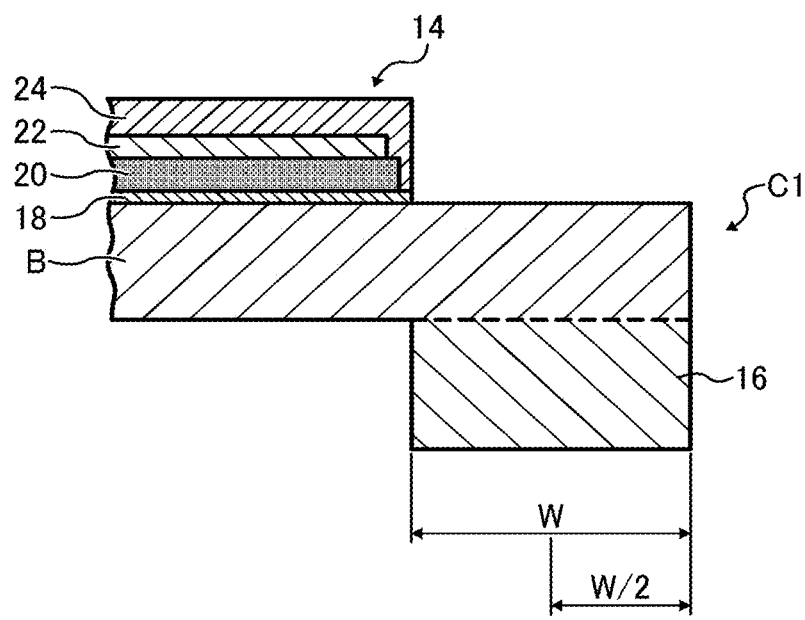
FIG. 6A is a sectional view of a connecting part that serves as a vibration damper, where the section is indicated by the line L-L' of FIG. 1.
Figure 6B:
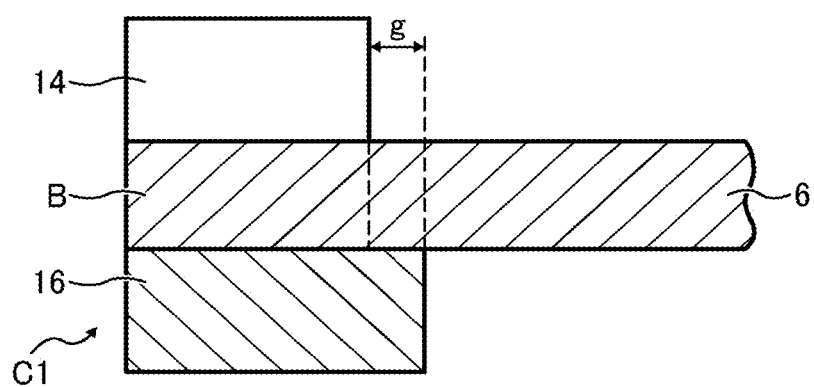
FIG. 6B is another sectional view of a connecting part that serves as a vibration damper, where the section is indicated by the line L1-L1' of FIG. 1.

In order to deal with the problems as described above, as illustrated in FIG. 6, the light deflector 2 according to the present embodiment is provided with a vibration damper at a portion of the serpentine beam that moves due to the deformation caused by the application of voltage, and such a vibration damper reduces the vibration in the direction perpendicular to the vibrating direction of the mirror unit 4. Note that such vibration in the direction perpendicular to the vibrating direction of the mirror unit 4 is an example of undesired vibration. More specifically, a vibration damper 16 is disposed at the connecting part C1 of the first serpentine beam 10 and the movable frame 6 (see FIG. 1). FIG. 6A is a sectional view of the connecting part C1, where the section is indicated by the line L-L' of FIG. 1. FIG. 6B is another sectional view of the connecting part C1, where the section is indicated by the line L1-L1' of FIG. 1.

As illustrated in FIG. 6A, the piezoelectric member 14 that is disposed on the surface of the beam B at the connecting part C1 includes a lower electrode 18, a piezoelectric material 20, an upper electrode 22, and an insulating layer 24, which are stacked in ascending order from the surface side of the beam B. The beam B is made of the same material as that of the movable frame 6, and the beam B and the movable frame 6 are integrally formed. The vibration damper 16 is made of the same material (member) as that of the beam B and the movable frame 6, and is formed by bonding a substrate of that material together and removing unnecessary portions.

In other words, the vibration damper 16 is formed by increasing the thickness of the substrate on the side opposite to the piezoelectric member 14. At the connecting part C2, the vibration damper 16 is formed in a similar manner. The vibration damper 16 may be integrally formed on the substrate in the manufacturing process, instead of bonding the substrates together. In FIG. 6B, the space between the movable frame 6 and the beam B is indicated by a reference sign "g".

A method of manufacturing the light deflector 2 is described below in detail. As known in the art, a silicon on insulator (SOI) substrate is used for the beam B and the vibration damper 16 that serve as first and second supporting layers, respectively, for supporting the piezoelectric member 14. In other words, a SOI substrate includes silicon on an active layer side (second supporting layer), an embedded oxide-film layer, and silicon on a base-material layer side (first supporting layer).

Firstly, a silicon oxide film is formed on the surface of the SOI substrate. Then, the films of a lower-electrode material, a piezoelectric material, and an upper-electrode material are formed thereon in that order. Then, each of the lower-electrode material, the piezoelectric material, and the upper-electrode material are patterned with a different pattern. In so doing, each patterning is performed so as to meet, for example, the desired performance of the light deflector, and the silicon oxide film is etched with the same pattern as that of the lower-electrode material.

As known in the art, a lower-electrode material is utilized as a wiring material. Firstly, an insulator film is formed, and a connection hole is made. Then, a lead material is formed, patterning is performed. Subsequently, an insulator film and a mirror film are formed. Then, patterning and etching are sequentially performed for an active layer, a base-material layer, and an embedded oxide-film to complete a light deflector.

The material and thickness of each element according to the present embodiment are described below.

Insulating layer 24: silicon dioxide (SiO$_2$) (thickness: 0.7 micrometer (μm))

Upper electrode 22: platinum (Pt) (thickness: 0.2 μm)

Piezoelectric material 20: lead zirconate titanate (PZT) (thickness: 2 μm)

Lower electrode 18: iridium (Ir) (thickness: 0.15 μm)

Beam: silicon (Si) (thickness: 40 μm)

Vibration damper 16: silicon (Si) (thickness: 40 μm, width: 200 μm)

Figure 7:
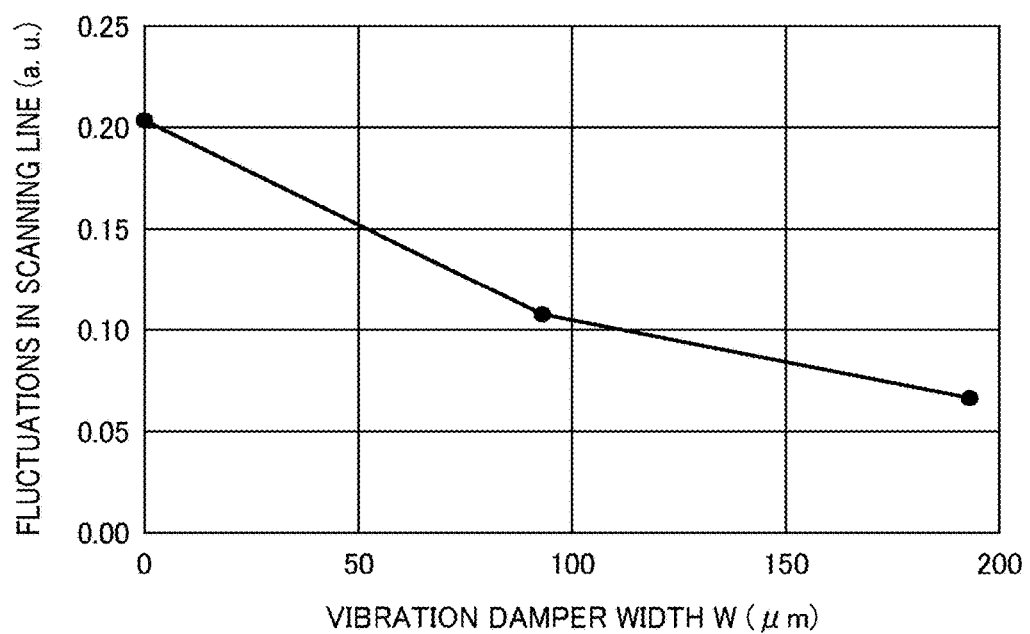
FIG. 7 is a graph indicating the relation between the width of a vibration damper and the amount of fluctuations in scanning line, according to the first embodiment of the present invention.

When the vibration damper 16 is absent at the connecting part C1 in the light deflector, as illustrated in FIG. 5A, fluctuations in scanning line occur in the laser scanning line. On the other hand, when the vibration damper 16 is formed at the connecting parts C1 and C2 in the light deflector, as illustrated in FIG. 5B, fluctuations in scanning line are successfully reduced in the laser scanning line. FIG. 7 is a graph indicating the relation between the width of the vibration damper 16 and the amount of fluctuations in scanning line, according to the present embodiment. More specifically, FIG. 7 indicates the results of the measurement of the fluctuations in scanning line, where cases in which the width W of the vibration damper 16 (see FIG. 6A) is reduced by one-half (100 μm) with reference to the embodiment described above are compared with cases in which the vibration damper 16 is absent. The fluctuations in scanning line indicates the ratio of the misregistration of the scanning line from a straight line due to mirror deflection to the direction of the scanning line approximated as the straight line in full width. As the value of the fluctuations in scanning line is smaller, the fluctuations in scanning line are successfully reduced. As seen from FIG. 7, the fluctuations in scanning line can be reduced to a degree where the image quality is not substantially affected, by optimizing the vibration damper 16.

In other words, even when a processing error is present in the manufacturing process of a light deflector or variations in the driving force of a piezoelectric member are present, imbalance due to such errors can be controlled by the vibration damper 16. Such controllability may contribute to an increase in the degree of flexibility in design of light deflectors. In the present embodiment, the vibration damper 16 is disposed at both the connecting parts C1 and C2. However, as long as a processing error of a light deflector or variations in the driving force of a piezoelectric member are sufficiently corrected, the vibration damper 16 may be disposed at any one of the connecting part C1 or the connecting part C2. The vibration damper 16 may be disposed in a range of area where the deformation operation of the beam of the serpentine beams is not affected.

In the present embodiment, for example, the optimization of a vibration damper achieved by varying the width W has been described. However, the vibration may also be controlled by optimizing the weight of the vibration damper, without varying the width W. The weight of the vibration damper is optimized, for example, by changing the material of the vibration damper. In such configuration, the vibration can more strongly be controlled by increasing the weight. Alternatively, the thickness (height) of the vibration damper may be adjusted without varying the width W. In such configuration, the thickness may partially be increased. For example, the thickness is relatively made greater as the vibration damper gets closer to the mirror unit.

Figure 8A:
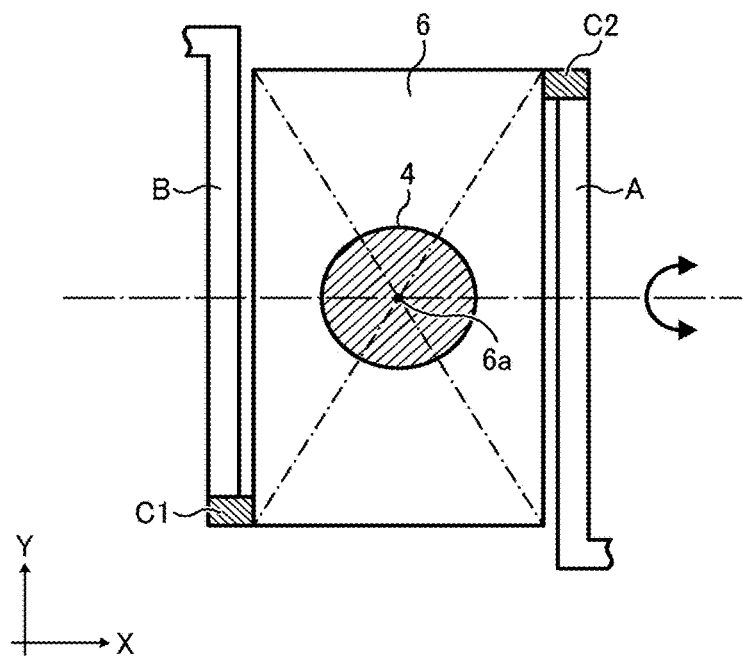
FIG. 8A is a schematic diagram of connecting parts in a state where the connecting parts are arranged in point symmetry about the center of a movable frame, according to the first embodiment of the present invention.
Figure 8B:
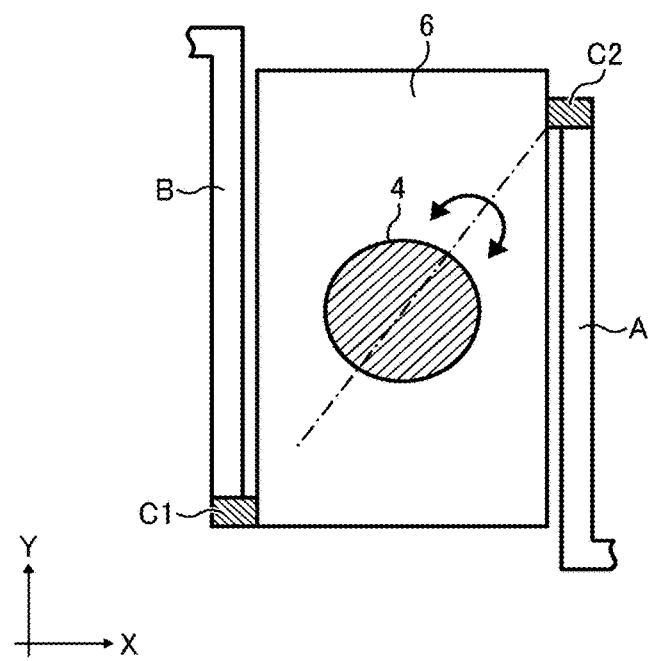
FIG. 8B is a schematic diagram of connecting parts in a state where the connecting parts are not arranged in point symmetry about the center of a movable frame, according to a counter sample of the present invention.

FIG. 8A is a schematic diagram of connecting parts C1 and C2 in a state where the connecting parts C1 and C2 are arranged in point symmetry about the center of the movable frame 6. In the light deflector 2 according to the present embodiment, as illustrated in FIG. 8A, the connecting part C1 of the first serpentine beam 10 and the movable frame 6 is arranged in point symmetry to the connecting part C2 of the second serpentine beam 12 and the movable frame 6, about a center point 6a of the movable frame 6. FIG. 8B is a schematic diagram of the connecting parts C1 and C2 in a state where the connecting parts C1 and C2 are not arranged in point symmetry about the center of the movable frame 6. As illustrated in FIG. 8B, when the connecting parts C1 and C2 are not arranged in point symmetry about the center point 6a of the movable frame 6, a difference in driving force is caused between the first serpentine beam 10 and the second serpentine beam 12, and the amount of torsional displacement in the Y-axis direction that causes fluctuations in scanning line increases. In other words, the driving balance on right and left sides of the movable frame 6 is lost, and unexpected torsional mode arises. As a matter of fact, such unexpected torsional mode leads to fluctuations in scanning line. By arranging the connecting parts C1 and C2 in a point symmetry about the center point 6a of the movable frame 6, fluctuations in scanning line can precisely be controlled. When a pair of vibration dampers are symmetrically arranged about the center of gravity of the movable frame, the weight is balanced in its entirety, and undesired inclination of the movable frame can be prevented.

A method of forming a lead zirconate titanate (PZT) film, which configures the piezoelectric material 20, includes a sputtering method or an applying method using a spinner of sol-gel liquid. PZT has a relatively high conversion efficiency between electricity and mechanical energy compared with other kinds of piezoelectric materials. Moreover, PZT can be manufactured with the known methods as above at low cost.

In the present embodiment, the vibration damper 16 is disposed at a connecting part, where the connecting part is an example of a portion that deforms due to the deformation of serpentine beams caused by the application of voltage. However, a portion at which a vibration damper is to be disposed is not limited to the connecting part as described above. The portions that move due to the deformation of a serpentine beam includes the serpentine beam itself, a connecting part, and a movable frame. As long as undesired vibration can be controlled with reference to the vibration at the mirror unit 4, a vibration damper may be disposed at any one of the serpentine beam itself, the connecting part, and the movable frame that move due to the deformation of the serpentine beam. The undesired vibration includes the vibration in a direction different from the vibrating direction of the mirror unit 4, for example, the vibration in the direction perpendicular to the vibrating direction of the mirror unit 4 as described above.

Figure 9:
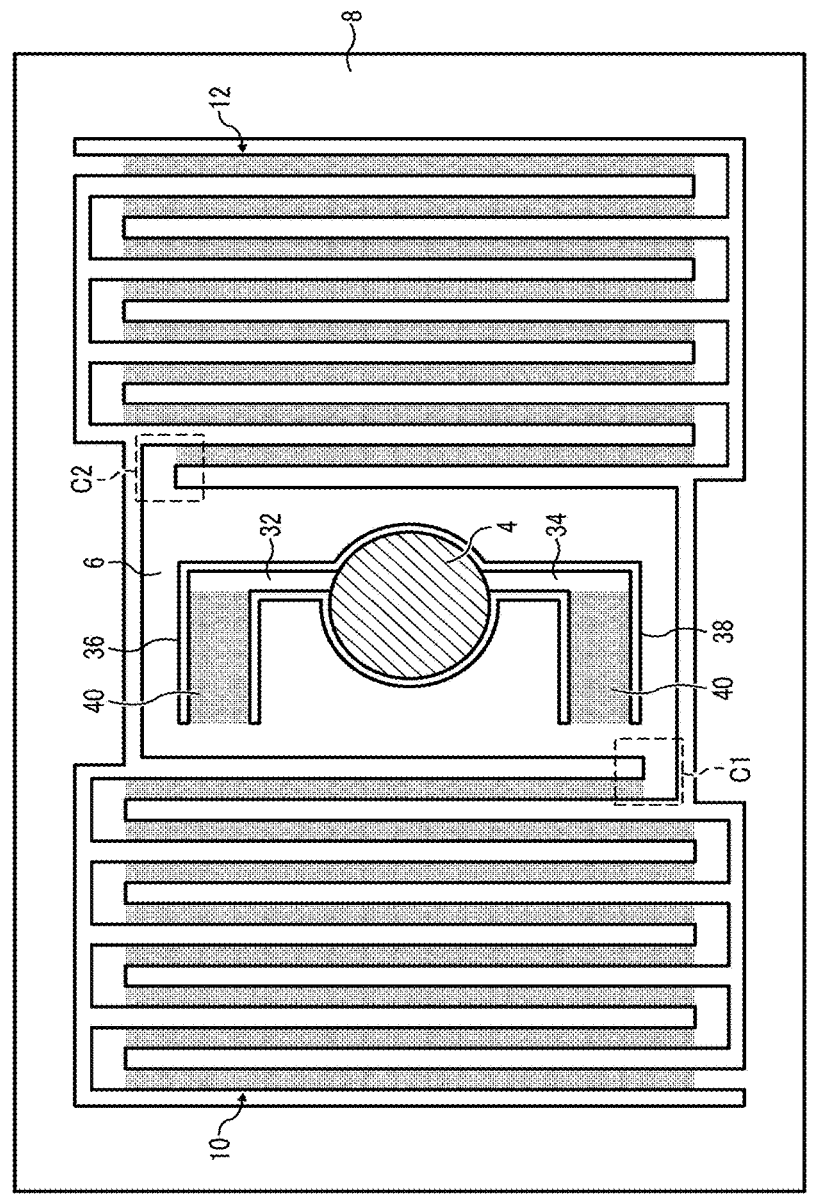
FIG. 9 is a front view of a light deflector according to a second embodiment of the present invention.
Figure 10:
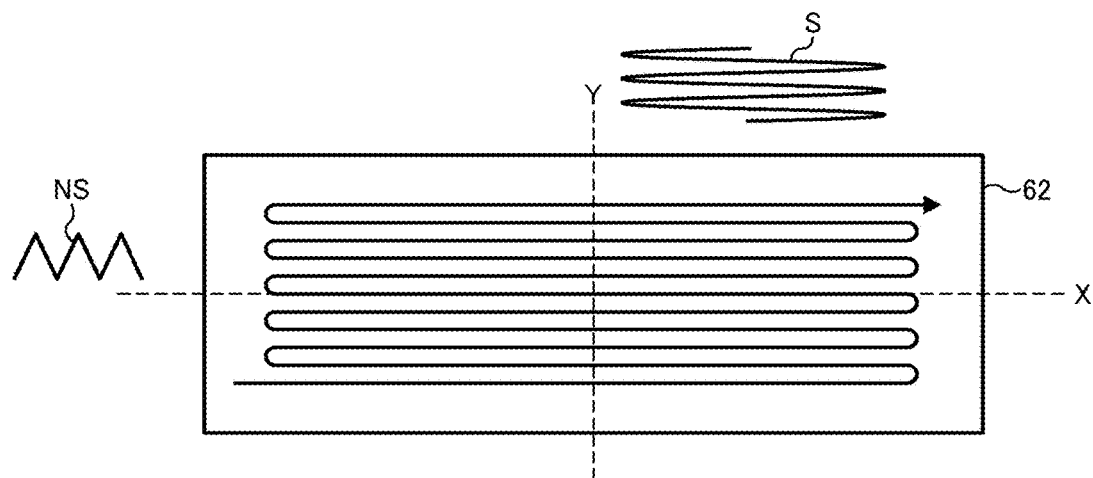
FIG. 10 is a diagram illustrating the relation between the biaxial scanning and vibration of a light deflector according to the second embodiment of the present invention.

The second embodiment of the present invention is described with reference to FIG. 9 and FIG. 10. In the description of the second embodiment, like reference signs are given to elements similar to those described in the first embodiment, and overlapping description may be omitted. FIG. 9 is a front view of a light deflector 30 according to a second embodiment of the present invention. As illustrated in FIG. 9, the light deflector 30 according to the present embodiment is a biaxial-scanning light deflector, and rotates and oscillates the mirror unit 4 around the Y-axis within the movable frame 6 of the light deflector 2 of FIG. 1. More specifically, the movable frame 6 includes torsion bars 32 and 34 that serve as a pair of elastic supporting members whose ends on one side are attached to the mirror unit 4 to support the mirror unit 4 so as to oscillate in a direction perpendicular to the direction of the oscillation caused by the deformation of the serpentine beams, and a pair of drive bars 36 and 38 each having one end attached to the other end of corresponding one of the torsion bars 32 and 34. The drive bars 36 and 38 are configured to deform by application of voltage.

The other ends of the drive bars 36 and 38 are integrated into the movable frame 6. The mirror unit 4, the torsion bars 32 and 34, and the drive bars 36 and 38 become operable by forming a trench in the movable frame 6. On the surface of the drive bars 36 and 38, the piezoelectric member 40 is provided in a similar manner to the beam of the serpentine beams. The drive bars 36 and 38 deform by application of voltage. When the drive bars 36 and 38 are driven, torsion is caused to the torsion bars 32 and 34 that support the mirror unit 4, and the mirror unit 4 rotates and oscillates around the Y-axis. The drive bars 36 and 38 are driven by sinusoidal wave, and mechanical resonance is used to rotate the mirror unit 4.

The configuration of the vibration dampers at the connecting parts C1 and C2 is the same as that of the first embodiment described above. As biaxial scanning is adopted in the present embodiment, the oscillating direction of the mirror unit 4 includes a main-scanning direction and a sub-scanning direction, and the vibration dampers at the connecting parts C1 and C2 reduce unwanted vibration in the main-scanning direction and the sub-scanning direction.

In the light deflector 30 according to the present embodiment, sinusoidal voltage of 20 kilohertz (kHz) is applied, and the mirror unit 4 rotates and oscillates at 20 kHz due to the torsion caused to the torsion bars 32 and 34. The light reflection plane may be operated to have the rotation angle of ±13 degrees of mechanical runout. When the first serpentine beam 10 and the second serpentine beam 12 are driven, the movable frame 6 rotates and oscillates around the X-axis, and the mirror unit 4 also rotates and oscillates accordingly.

In the light deflector 30, voltage of sawtooth waveform is applied to every other one of the piezoelectric members 14, which are disposed on each beam of the serpentine beams in an independent manner, to perform non-resonant driving. In the raster scanning with such non-resonant driving, sawtooth waveform of 60 hertz (Hz) is used for operation. FIG. 10 is a diagram illustrating the relation between the biaxial scanning and vibration of the light deflector 30 according to the present embodiment. As illustrated in FIG. 10, biaxial laser scanning is enabled by the sinusoidal oscillation S in the Y direction caused by mechanical resonance and the rotation in the X direction caused by non-resonant driving NS. In FIG. 10, the reference sign 62 indicates a projection plane.

Figure 11:
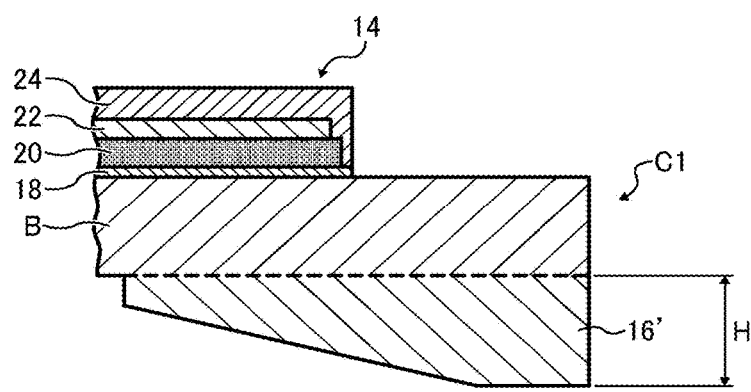
FIG. 11 is a sectional view of a vibration damper, where the section is indicated by the line L-L' of FIG. 1, according to a modification of the present invention.

In the embodiments described above, rectangular-parallelepiped vibration dampers whose sides are rectangular are described. However, no limitation is indicated thereby. For example, as illustrated in FIG. 11, a vibration damper 16' may be provided whose thickness gently increases when viewed from the beam side of the serpentine beam to the connecting part.

Figure 12:
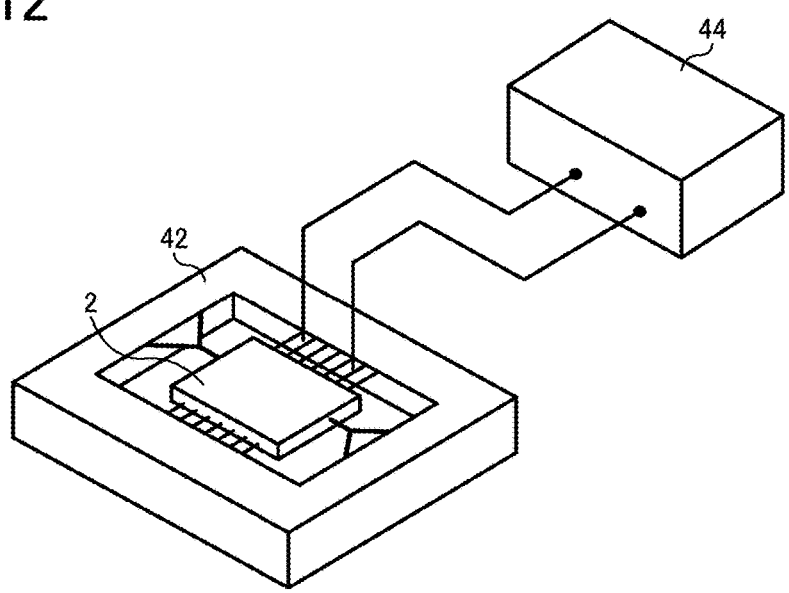
FIG. 12 is a perspective view of an implementation of a light deflector, according to the second embodiment of the present invention.

FIG. 12 is a perspective view of an implementation of the light deflector 2 according to the embodiments of the present invention. The light deflector 2 is covered by the package 42. The package 42 is made of, for example, resin or ceramic materials. The upper and lower electrodes of the light deflector 2 are electrically connected to the driving circuit 44, and the driving circuit 44 is used to apply voltage to between the upper and lower electrodes.

Figure 13:
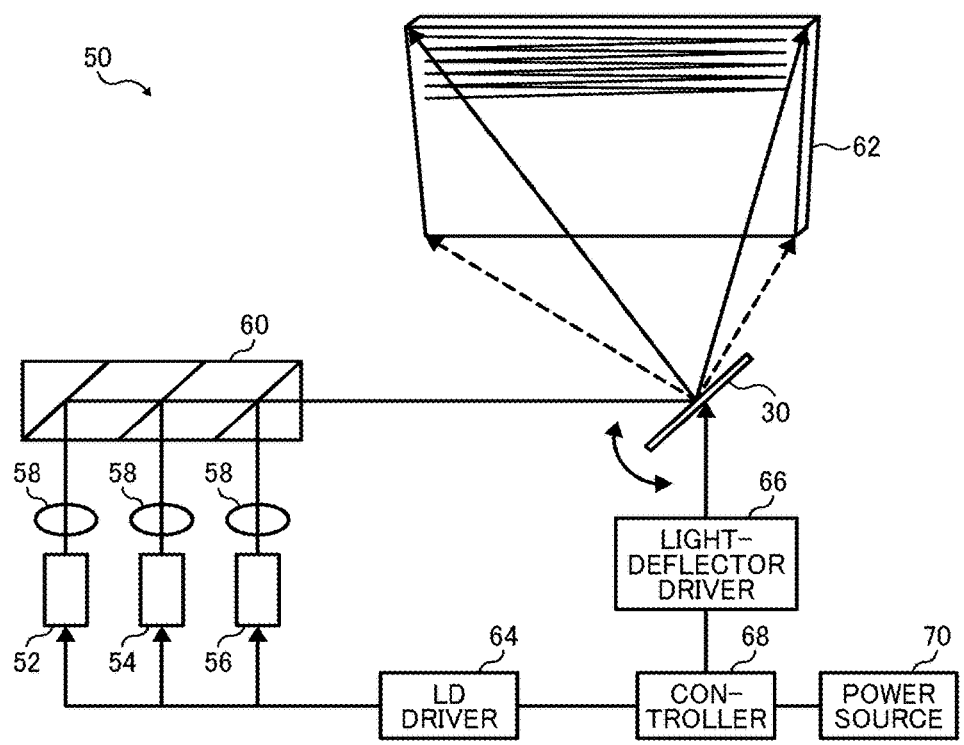
FIG. 13 is a diagram illustrating a projector that serves as a two-dimensional image display apparatus, according to a third embodiment of the present invention.

The third embodiment of the present invention (two-dimensional image display apparatus) is described with reference to FIG. 13 and FIG. 14. FIG. 13 is a diagram illustrating the projector 50 that serves as a two-dimensional image display apparatus, according to the present embodiment. In the projector 50, the light that is each emitted from a red laser beam source 52, a green laser beam source 54, and a blue laser beam source 56 is collimated by a corresponding collimator lens 58, and parallel light is exited. More specifically, light sources that emit red laser of 640 nanometer (nm) wavelength, green laser of 520 nm, and blue laser of 450 nm are used. The collimated laser beam enters an optical-path combiner 60. The optical-path combiner 60 uses an optical-path combining prism such as a dichroic mirror to combine three optical paths into a single optical path.

The optical-path combiner 60 has three reflection planes. The combined laser beam is two-dimensionally scanned by the biaxial-scanning light deflector 30 that serves as a two-dimensional scanner for drawing an image, and the image is formed on a screen 62 that serves as a projection plane. An image is formed on the screen 62 by performing two-dimensional optical scanning on the laser beam by the light deflector 30 and modulating the intensity of the laser beam sources. In so doing, intensity modulation signals for the light sources are sent from a laser diode (LD) driver 64, and an instruction for the optical scanning direction of the light deflector 30 to the screen 62 is sent from a light-deflector driver 66. The light deflector 2 and the LDs for forming an image are controlled by a controller 68. In FIG. 13 and FIG. 14, the reference sign 70 indicates a power source.

Figure 14:
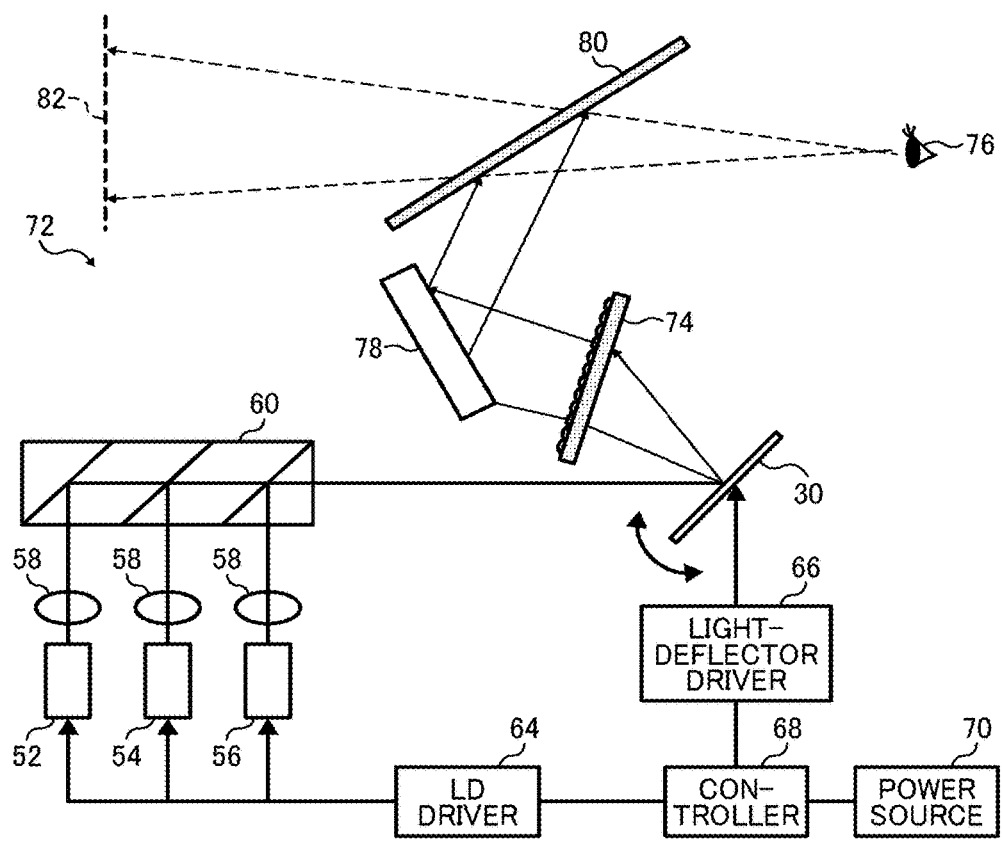
FIG. 14 is a diagram illustrating a heads-up display that serves as a two-dimensional image display apparatus, according to the third embodiment of the present invention.

FIG. 14 is a diagram illustrating a heads-up display 72 that serves as a two-dimensional image display apparatus, according to the present embodiment. In the heads-up display 72, a microlens array 74 is used as a screen, and an image is formed on the microlens array 74. An observer 76 can visually recognize a virtual image 82 over a combiner 80 that serves as a translucent member, where the virtual image is magnified via a projector mirror 78 and the combiner 80.

In such configuration, the laser beam is dispersed by the microlens array 74. For this reason, the virtual image 82 in which the speckle noise is reduced can visually be recognized. A combiner is usually used as a translucent member. However, in a vehicle-installed heads-up display, a windowpane may be used as a translucent member.

Figure 15:
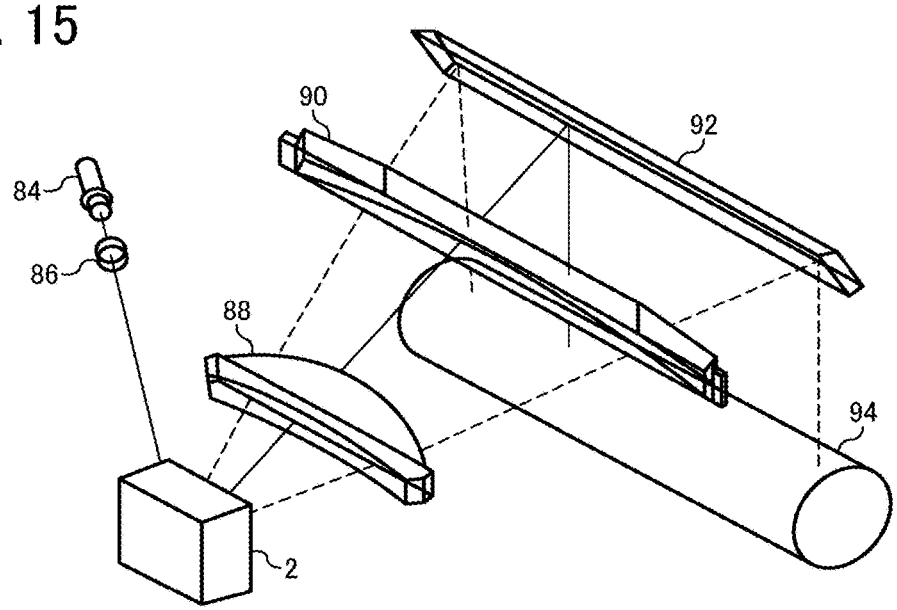
FIG. 15 is a perspective view of an optical scanner according to a fourth embodiment of the present invention.

The fourth embodiment of the present invention (optical scanner) is described with reference to FIG. 15. As illustrated in FIG. 15, the laser beam emitted from the laser element 84 that serves as a light source passes through a collimate optical system 86, and is deflected by the light deflector 2. The deflected laser beam is formed in a state of spot on a to-be-scanned surface 94 such as a photoconductor drum after passing through an imaging optical system that includes an fθ lens 88 (first lens), a toroidal lens 90 (second lens), and a mirror 92. The light deflector 2 may be replaced with the biaxial-scanning light deflector 30.

Figure 16:
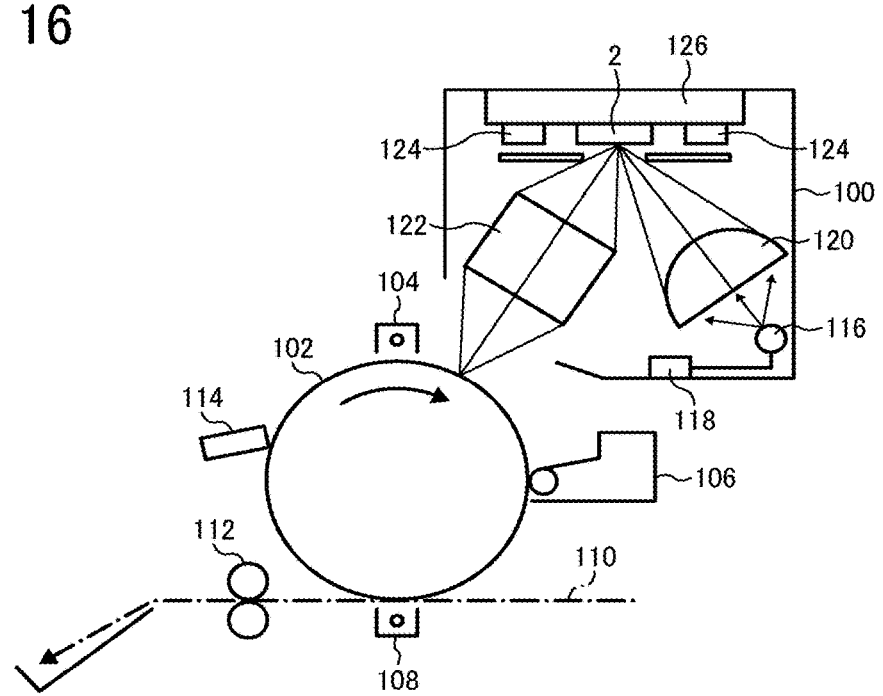
FIG. 16 is a diagram illustrating an image forming apparatus according to a fifth embodiment of the present invention.

The fifth embodiment of the present invention (image forming apparatus) is described with reference to FIG. 16. An optical scanner 100 scans the surface (to-be-scanned surface) of the photoconductor drum 102 that serves as an image bearer, using a single or a plurality of laser beams modulated by a recording signal, in the axial direction of the photoconductor drum 102. The photoconductor drum 102 is driven to rotate in the direction indicated by an arrow, and the surface that is charged by a charging device 104 is optically scanned by the optical scanner 100 based on the image data. Accordingly, an electrostatic latent image is formed. The electrostatic latent image is visualized by a developing device 106 as a toner image, and the toner image is transferred by a transfer unit 108 to a recording paper 110 that serves as transfer medium. The transferred toner image is fixed by a fixing unit 112 to the recording paper 110. The residual toner on the surface of the photoconductor drum 102 that has passed through the transfer unit 108 of the photoconductor drum 102 is removed by a cleaner 114.

A belt type photoconductor may be used in place of the photoconductor drum 102. An intermediate transfer system may be adopted in which a toner image is temporarily transferred to a transfer medium other than a recording paper and the toner image is transferred from the transfer medium to a recording paper and is fixed.

The optical scanner 100 includes a light source 116 that emits a single or a plurality of laser beams modulated by a recording signal, a light source driver 118 that modulates the light source 116, and the light deflector 2. Moreover, the optical scanner 100 includes, for example, an imaging optical system 120 that forms an image of the light beam emitted from the light source 116, on the light reflection plane of the light deflector 2, and a scanning optical system 122 that forms an image of the light beam reflected at the light reflection plane on the surface of the photoconductor drum 102. The light deflector 2 is mounted on a substrate 126 together with an integrated circuit 124 that drives the light deflector 2, and is integrated into the optical scanner 100. The light deflector 2 may be replaced with the biaxial-scanning light deflector 30.

The light deflector according to the embodiments of the present invention requires a low power consumption to operate compared with a polygon mirror, and thus is advantageous in power-saving of an image forming apparatus. The light deflector makes a smaller wind noise when the mirror unit 4 oscillates compared with a polygon mirror, and thus is advantageous in achieving low noise of an image forming apparatus. The optical scanner according to the embodiments of the present invention requires much smaller footprint than that of a polygon mirror, and the amount of the heat generated by the light deflector 2 is a little. Accordingly, it is advantageous in downsizing the image forming apparatus. Note that the conveyance system of the recording paper, the driving mechanism of the photoconductor drum, the controller of the developing device and the transfer unit, and the drive system of the light source are similar to those of the conventional image forming apparatus, and thus are omitted.

The present invention is not limited to the details of the example embodiments described above, and various modifications and improvements are possible.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:
1. A light deflector comprising:
a mirror unit having a light reflection plane;
a movable frame to support the mirror unit;
a support frame disposed to surround the movable frame; and
a pair of serpentine beams each disposed between the movable frame and the support frame on both sides of the movable frame to form a turning shape, each of the serpentine beams having one end attached to the support frame, and another end attached to a connecting part between one of the serpentine beams and the movable frame;

wherein the pair of serpentine beams, the connecting part, and the movable frame include at least a first silicon layer that is integrally formed, wherein the serpentine beams includes a piezoelectric element on the first silicon layer, wherein the connecting part includes a second silicon layer as a vibration damper on a side opposite the piezoelectric element on the first silicon layer of the serpentine beams, and the second silicon layer reduces vibration caused by the piezoelectric element through an oxidized silicon layer.

2. The light deflector according to claim 1, wherein the vibration damper is disposed at a connecting part of the serpentine beams and the movable frame.

3. The light deflector according to claim 2, wherein the vibration damper is formed by increasing a thickness of the second silicon layer on a side opposite to the piezoelectric member.

4. The light deflector according to claim 1, wherein the vibration damper is formed by a same component as that of the movable frame and the serpentine beams.

5. The light deflector according to claim 1, wherein the movable frame and the serpentine beams have a pair of connecting parts therebetween, and the pair of connecting parts are arranged in a point symmetry around the mirror unit.

6. The light deflector according to claim 1, wherein the movable frame internally includes a pair of elastic supporting members each having one end attached to the mirror unit and configured to support the mirror unit in an oscillatable manner in a direction perpendicular to a direction of the oscillation caused by the deformation of the serpentine beams, and a pair of drive bars each having one end attached to another end of corresponding one of the elastic supporting members, the pair of drive bars being configured to deform by application of voltage.

7. A two-dimensional image display apparatus comprising:

a light source configured to emit a plurality of laser beams of different wavelengths;

an optical-path combiner configured to combine optical paths of the laser beams into one optical path; and a two-dimensional scanner configured to scan the combined laser beams to draw an image, wherein the two-dimensional scanner is the light deflector according to claim 1, wherein the movable frame internally includes a pair of elastic supporting members each having one end attached to the mirror unit and configured to support the mirror unit in an oscillatable manner in a direction perpendicular to a direction of the oscillation caused by the deformation of the serpentine beams, and a pair of drive bars each having one end attached to another end of corresponding one of the elastic supporting members, the pair of drive bars being configured to deform by application of voltage, and the light deflector performs optical deflection and projects an image onto a projection plane.

8. An optical scanner comprising:

a light source configured to emit light;

a light deflector configured to deflect light beam emitted from the light source; and an imaging optical system configured to form an image of deflected light beam in a state of spot on a to-be-scanned surface, wherein the light deflector is the light deflector according to claim 1.

9. An image forming apparatus comprising:

an image bearer;

an optical scanner configured to form an electrostatic latent image on the image bearer according to image data;

a developing device configured to visualize the electrostatic latent image to form a visible image; and a transfer unit configured to transfer the visible image to a transfer medium, wherein the optical scanner includes a light source configured to emit light, a light deflector configured to deflect light beam emitted from the light source, and an imaging optical system configured to form an image of deflected light beam in a state of spot on a to-be-scanned surface, wherein the light deflector is the light deflector according to claim 1.

10. The light deflector according to claim 1, wherein the vibration damper extends from the one of the connecting parts towards the movable frame and terminates at an edge of the movable frame.

11. The light deflector according to claim 1, wherein a vibration damper has point symmetry with a vibration damper across a mirror center, and one end of the serpentine beams has point symmetry with another end of the serpentine beams across the mirror center.

12. The light deflector according to claim 1, wherein:

the piezoelectric element is indirectly on the first silicon layer.

13. The light deflector according to claim 12, further comprising:

an electrode between the between the piezoelectric element and the first silicon layer.

* * * * *